United States Patent [19]
Bill et al.

[11] Patent Number: 6,046,932
[45] Date of Patent: Apr. 4, 2000

[54] CIRCUIT IMPLEMENTATION TO QUENCH BIT LINE LEAKAGE CURRENT IN PROGRAMMING AND OVER-ERASE CORRECTION MODES IN FLASH EEPROM

[75] Inventors: Colin Bill, Cupertino; Sameer S. Haddad, San Jose; Jonathan Shi-Chang Su, San Gabriel; Vei-Han Chan, San Jose, all of Calif.

[73] Assignee: Advanced Micro Devices, Inc., Sunnyvale, Calif.

[21] Appl. No.: 09/417,273

[22] Filed: Oct. 13, 1999

Related U.S. Application Data

[60] Provisional application No. 60/148,779, Aug. 13, 1999.
[51] Int. Cl.[7] .............................. G11C 16/12; G11C 16/16
[52] U.S. Cl. ................................ 365/185.02; 365/185.12; 365/185.13; 365/185.3; 365/185.33
[58] Field of Search .......................... 365/185.02, 185.12, 365/185.13, 185.3, 185.33

[56] References Cited

U.S. PATENT DOCUMENTS 5,642,311  6/1997  Cleveland et al. .................... 365/185.3

*Primary Examiner*—Andrew Q. Tran
*Attorney, Agent, or Firm*—H. Donald Nelson

[57] ABSTRACT

A method of and a flash memory device for quenching bitline leakage current during programming and over-erase correction operations. The flash memory cells are organized in an array of I/O blocks with each block having columns and rows. An array of resistors is connected between the common array source connection and ground. The array of resistors is made up of sets of resistors, each set having a programming mode resistor and an APDE mode resistor. A data buffer switches either a programming mode resistor or APDE mode resistor into the circuit when a bitline is selected for either programming or APDE. The values of the resistors are selected to raise the voltage at the source above a selected threshold voltage of the memory cells so that over-erased cells will not provide leakage current to the bitline during either programming or APDE.

12 Claims, 4 Drawing Sheets

CIRCUIT IMPLEMENTATION TO QUENCH BIT LINE LEAKAGE CURRENT IN PROGRAMMING AND OVER-ERASE CORRECTION MODES IN FLASH EEPROM

This application claims benefit of Provisional Application Serial No. 60/148,779 filed Aug. 13, 1999.

BACKGROUND OF THE INVENTION

1. Field of the Invention

This invention relates generally to the art of microelectronic integrated circuits. More specifically, this invention relates to programmable semiconductor memories. Even more specifically, this invention relates to a circuit implementation and method to quench bit line leakage current during programming and over-erase correction mode of a flash Electronically Erasable Programmable Read-Only Memory (EEPROM).

2. Discussion of the Related Art

A microelectronic flash or block erase Electrically Erasable Programmable Read-Only Memory (Flash EEPROM) includes an array of cells that can be independently programmed and read. The size of each cell and thereby the memory are made small by omitting select transistors that would enable the cells to be erased independently. All of the cells are erased together as a block.

A memory of this type includes individual Metal-Oxide-Semiconductor (MOS) field effect transistor memory cells, each of which includes a source, drain, floating gate and control gate to which various voltages are applied to program the cell with a binary 1 or 0, or erase all of the cells as a block.

The cells are connected in a rectangular array of rows and columns, with the control gates of the cells in a row being connected to a respective wordline and the drains of the cells in a column being connected to a respective bitline. The sources of the cells are connected together. This arrangement is known as a NOR memory configuration.

A cell is programmed by applying typically 9–10 volts to the control gate, 5 volts to the drain and grounding the source, which causes hot electrons to be injected from the drain depletion region into the floating gate. Upon removal of the programming voltages, the injected electrons are trapped in the floating gate and create a negative charge therein that increases the threshold voltage of the cell to a value in excess of approximately 4 volts.

The cell is read by applying typically 5 volts to the control gate, 1 volt to the bitline to which the drain is connected, grounding the source, and sensing the bitline current. If the cell is programmed and the threshold voltage is relatively high (4 volts), the bitline current will be zero or at least relatively low. If the cell is not programmed or erased, the threshold voltage will be relatively low (2 volts), the control gate voltage will enhance the channel, and the bitline current will be relatively high.

A cell can be erased in several ways. In one arrangement, applying typically 12 volts to the source, grounding the control gate and allowing the drain to float erases a cell. This causes the electrons that were injected into the floating gate during programming to be removed by Fowler-Nordheim tunneling from the floating gate through the thin tunnel oxide layer to the source. Alternatively, applying a negative voltage on the order of minus 10 volts to the control gate, applying 5 volts to the source and allowing the drain to float can erase a cell.

A problem with the conventional flash EEPROM cell arrangement is that due to manufacturing tolerances, some cells become overerased before other cells become erased sufficiently. The floating gates of the overerased cells are depleted of electrons and become positively charged. This causes the overerased cells to function as depletion mode transistors that cannot be turned off by normal operating voltages applied to their control gates, and introduces leakage during subsequent program and read operations.

More specifically, during program and read operations only one wordline that is connected to the control gates of a row of cells is held high at a time, while the other wordlines are grounded. However, a positive voltage is applied to the drains of all of the cells. If the threshold voltage of an unselected cell is very low, zero or negative, leakage current will flow through the source, channel and drain of the cell.

In a typical flash EEPROM, the drains of a large number, for example 512 transistor memory cells are connected to a bitline. If a substantial number of cells on the bitline are drawing background leakage current, the total leakage current on the bitline can exceed the cell read current. This makes it impossible to read the state of a cell on the bitline and renders the memory inoperative. The threshold voltages of the bits in an array typically form a voltage distribution with the least erased cells having a relatively high threshold voltage $V_T$MAX whereas the most overerased cells have a minimum acceptable value $V_T$MIN that can be zero or negative. The lower the threshold voltage and the wider the threshold voltage distribution the higher the leakage current. It is therefore desirable to prevent cells from being overerased and to reduce the threshold voltage distribution to as low a range as possible, with ideally all cells having the same high threshold voltage after erase on the order of 2 volts.

It is known in the art to reduce the threshold voltage distribution by performing an overerase correction operation that reprograms the most overerased cells to a higher threshold voltage. This operation will result in the threshold voltage distribution with all of the cells having a threshold voltage above a minimum acceptable value. An overerase correction operation of this type is generally known as Automatic Programming Disturb (APD).

A preferred APD method that is referred to as Automatic Programming Disturb Erase (APDE) is disclosed in U.S. Pat. No. 5,642,311, entitled "OVERERASE CORRECTION FOR FLASH MEMORY WHICH LIMITS OVERERASE AND PREVENTS ERASE VERIFY ERRORS," issued Jun. 24, 1997 to Lee Cleveland. The method includes sensing for overerased cells and applying programming pulses thereto that bring their threshold voltages back up to acceptable values.

Following application of an erase pulse, undererase correction is first performed on a cell-by-cell basis by rows. The cell in the first row and column position is addressed and erase verified by applying 4 volts to the control gate (wordline), 1 volt to the drain (bitline), grounding the source, and using sense amplifiers to sense the bitline current and thereby determine if the threshold voltage of the cell is above a value of, for example, 2 volts. If the cell is undererased (threshold voltage above 2 volts), the bitline current will be low. In this case, an erase pulse is applied to all of the cells and the first cell is erase verified again.

After application of each erase pulse and prior to a subsequent erase verify operation, overerase correction is performed on all of the cells of the memory. Overerase verify is performed on the bitlines of the array in sequence. This is accomplished by grounding the wordlines, applying typically 1 volt to address the first bitline and sensing the bitline current. If the current is above a predetermined value, this indicates that at least one of the cells connected to the bitline is overerased and is drawing leakage current. In this case, an overerase correction pulse is applied to the bitline. This is accomplished by applying approximately 5 volts to the bitline for a predetermined length of time such as 100 μs.

After application of the overerase correction pulse the bitline is verified again. If bitline current is still high indicating that an overerased cell still remains connected to the bitline, another overerase correction pulse is applied. This procedure is repeated for all of the bitlines in sequence. The procedure is repeated as many times as necessary until the bitline current is reduced to the predetermined value which is lower than the read current. Then, the procedure is performed for the rest of the cells in the first row and following rows until all of the cells in the memory have been erase verified.

By performing the overerase correction procedure after each erase pulse, the extent to which cells are overerased is reduced, improving the endurance of cells. Further, because overerased cells are corrected after each erase pulse, bitline leakage current is reduced during erase verify, thus preventing undererased cells from existing upon completion of the erase verify procedure.

Although the APDE method is effective in eliminating overerased cells, it is limited in that since the sources and wordlines of the cells are grounded during overerase correction, overerased cells will draw background leakage current while the overerase correction pulses are being applied. The leakage current requires the provisions of a large power supply.

Even if the process parameters are controlled such that overerase correction pulses will not create undererased cells, the amount by which the threshold voltage distribution can be reduced is inherently limited because there is no mechanism for preventing the threshold voltages of properly erased cells from being further increased by overerase correction pulses applied thereto. In addition, background leakage current is also present during programming and creates similar problems.

These problems are exacerbated as the supply voltage $V_{CC}$ is reduced in step with the reduction of feature sizes of EEPROMs. The threshold voltages of the erased cells must be reduced to accommodate the lower values of $V_{CC}$. This results in more cells in the threshold voltage distribution drawing leakage current.

In a sufficiently low $V_{CC}$ application, so many cells will draw leakage current that the total bitline leakage current during erase verify can exceed the value corresponding to an erased cell, even if the cell being verified is undererased. This makes it impossible to determine the state of a cell during erase verify and read, and renders the memory inoperative. This problem has remained unsolved in the prior art and has severely hindered the development of reduced voltage EEPROMs.

Another undesirable effect that becomes especially problematic at low values of $V_{CC}$ is that if $V_{CC}$ is applied directly to a wordline, it will be insufficient to enhance the channel of a selected cell such that a verify operation can be performed during erase. For this reason, a charge pump is provided to boost the wordline voltage to a value that is sufficiently higher than $V_{CC}$ so that cell verification can be reliably performed. For a value of $V_{CC}$=3 volts, the wordline voltage is typically boosted to a value of approximately 4–5 volts.

Voltages are applied to bitlines through pass transistors that enable individual bitline selection. The background leakage current loads down the charge pump and increases the voltage drop across the pass transistors, resulting in a lower drain voltage being applied to the cells. If the drain voltage becomes too low because of excessive leakage current, the cell operation can become unstable and unreliable.

In order to reliably program a memory cell, the drain to source voltage of the cell must be greater than 4 volts, that is, $V_{DS}$ must be greater than 4 volts. Because there is finite resistance in the bitline, any increase in bitline leakage current will result in a greater voltage drop across the bitline resistance and can cause the $V_{DS}$ voltage to drop below the required voltage. A similar effect can occur during the APDE operation.

Therefore, what is needed is a flash memory device and method that decreases the bitline leakage current during programming and APDE of the flash memory device.

SUMMARY OF TEE INVENTION

According to the present invention, the foregoing and other objects and advantages are achieved by a device and method to quench bitline leakage current during programming and APDE of a flash memory device. The flash memory device has flash memory cells organized in an array of I/O blocks, each I/O block having m columns and p rows. A data buffer is connected to bitlines in each I/O block. An array of resistors is connected between a common array source connection and selected resistors in the resistor array are switched into the circuit depending upon whether a programming operation is being conducted or whether an APDE operation is being conducted.

In accordance with another aspect of the invention, the resistor array is made up of a set of resistors for each I/O block. Each set of resistors includes a programming mode resistor and an APDE mode resistor. Each programming mode resistor and APDE mode resistor is associated with a switch.

In accordance with another aspect of the invention, the data buffer switches either the programming mode resistor or the APDE mode resistor into the circuit depending on whether a memory cell connected to a respective bitline in the I/O block is being programmed or being subjected to an APDE operation.

The described method and device thus provides for the quenching of bitline leakage current during the programming or APDE of the memory device. This provides a more reliable programming and APDE operation.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DETAILED DESCRIPTION

Reference is now made in detail to a specific embodiment of the present invention that illustrates the best mode presently contemplated by the inventors for practicing the invention.

Figure 1:
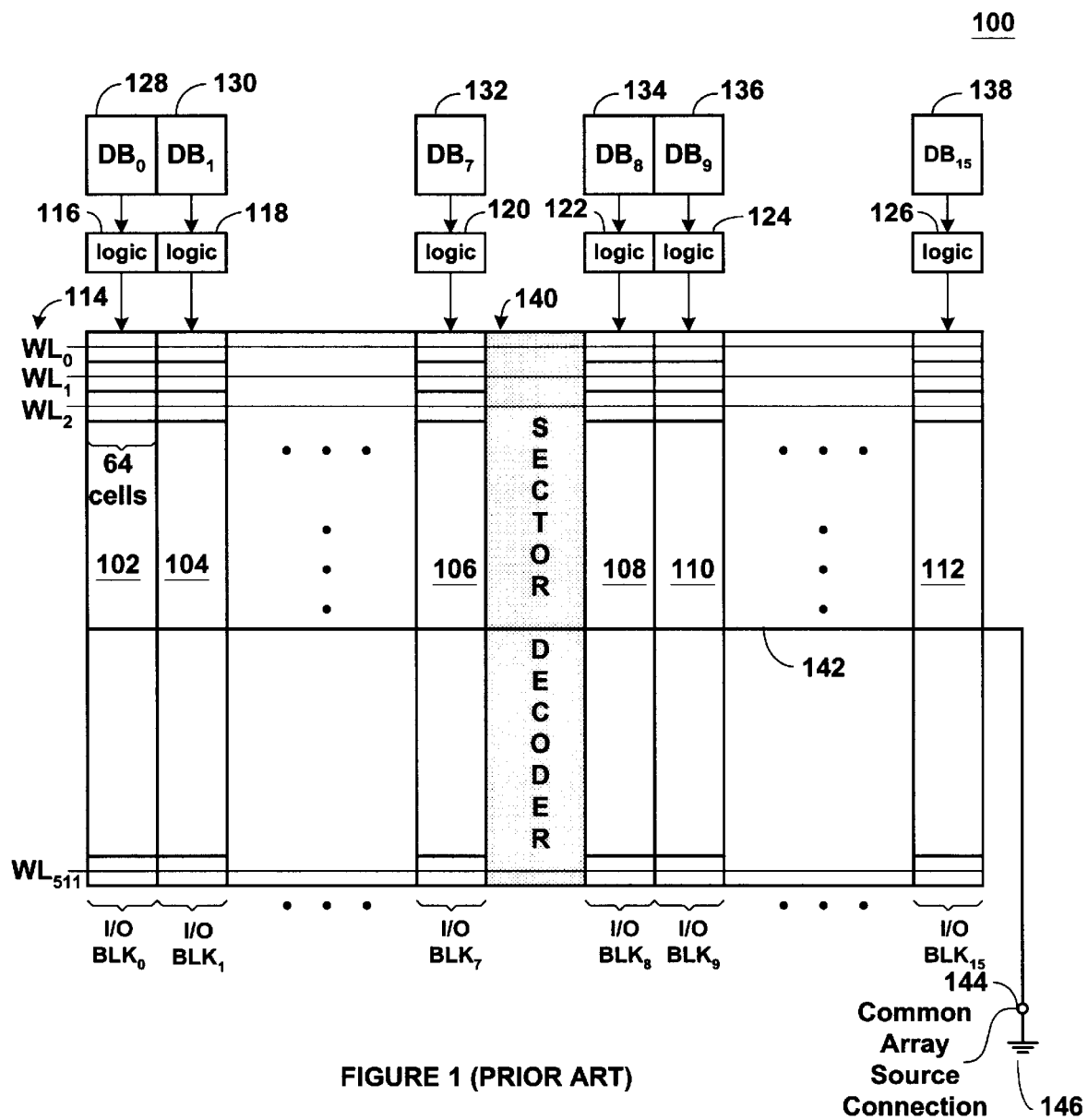
FIG. 1 is a simplified schematic diagram of a sector of a prior art flash memory device having 16 I/O blocks, 64 memory cells per row per I/O block, 512 rows (wordlines) and a common array source connection terminating at ground voltage.

FIG. 1 is a simplified schematic diagram of a sector 100 of a flash memory device with memory cells being organized in 16 I/O blocks, each I/O block having 64 memory cells per row and 512 rows. It is noted that the number of I/O blocks, the number of memory cells per row in the I/O block and the number of rows in the I/O block are arbitrary and other sizes and memory cell organizations are comprehended by this invention.

The sector 100 has 16 I/O blocks such as I/O blocks I/O $BLK_0$ 102, I/O $BLK_1$ 104, I/O $BLK_2$, 106, I/O $BLK_8$ 108, I/O $BLK_9$ 110, and I/O $BLK_{15}$ 112. Each I/O block is 64 memory cells wide and each memory cell in a row has a control gate connected to a common wordline, as indicated at 114. Wordlines are shown at $WL_0$, $WL_1$, $WL_2$, and $WL_{511}$. The drain of each memory cell in a column is connected to a bitline (not shown) and as should be appreciated, each I/O block would then have 64 columns of memory cells and therefore 64 bitlines. A specific column (or bitline) in an I/O block is selected by logic, such as the logic shown at 116, 118, 120, 122, 124, and 126. A data buffer, such as $DB_0$ 128, $DB_1$ 130, $DB_7$ 132, $DB_8$ 134, $DB_9$ 136, and $DB_{15}$ 138, drives each I/O block logic. The function of the data buffers and the logic will be discussed below. As is known in the flash memory art, there are sector decoders (not shown) that surround the sector and a sector decoder section 140 that is placed within the sector. The function of the sector decoder section 140 is not an issue in this invention and will not be further discussed. The sources of each memory cell are connected to a common array source connection, as represented by line 142 and common array source connection terminal 144. As is known in the flash memory art, wordline decoders allow each of the wordlines, indicated at 114 to be individually selected for the application of a specific voltage, the data buffers and logic allow each bitline to be individually selected for the application of a specific voltage, however, the common source connection prevents the sources of an individual column or row of sources to be selected, that is, all of the sources in the sector always have the same voltage applied thereto. For example, during programming and APDE the common array source connection 144 is connected to ground as shown at 146.

Figure 2:
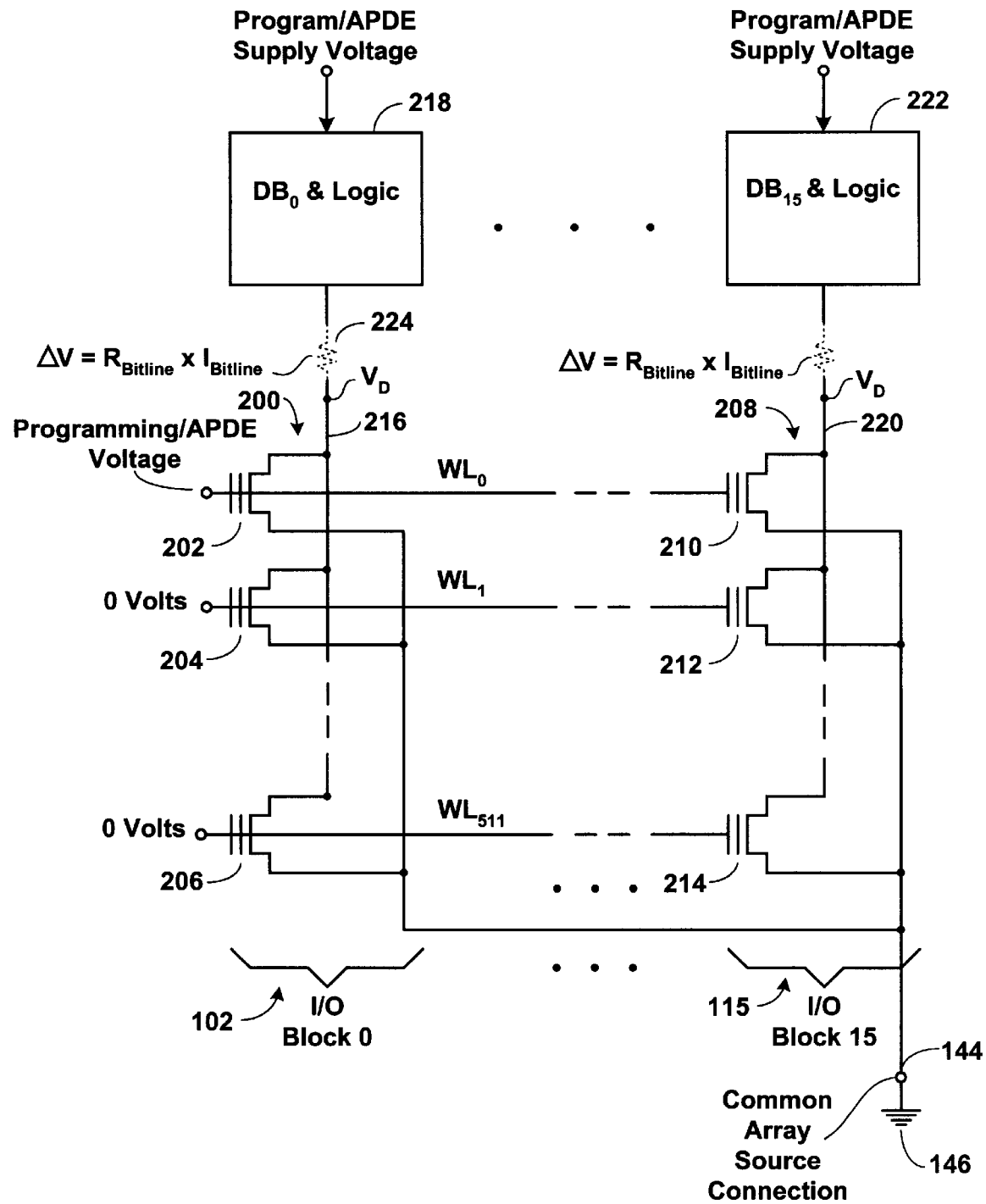
FIG. 2 is a detailed schematic diagram of a portion of the flash memory device shown in FIG. 1.

FIG. 2 is a detailed schematic diagram of a portion of the sector 100 showing a portion of I/O blocks 102 and 112 as shown in FIG. 1. A portion of one column of memory cells in I/O Block 0 102 is shown at 200 showing memory cells 202, 204 and 206. A portion of one column of memory cells in I/O Block 15 115 is shown at 208 showing memory cells 210, 212 and 214. The wordline $WL_0$ is shown connecting the control gates of memory cells 202 and 208, the wordline $WL_1$ is shown connecting the control gates of memory cells 204 and 212, and the wordline $WL_{511}$ is shown connecting the control gates of memory cells 206 and 214. It should be appreciated that each wordline is connected to the control gates of all the memory cells in each I/O block from I/O $Blk_0$ to I/O $Blk_{15}$. Since there are 64 memory cells in a row in each I/O block and there are 16 I/O blocks there are 64×16=1024 control gates connected to each wordline. The bitline 216 of the column 200 is selected by the data buffer $DB_0$ & Logic circuitry 218. There is a data buffer and associated logic circuitry for each I/O block and the data buffer and associated logic circuitry selects a specific bitline from the 64 bitlines (columns of memory cells) in the I/O block. For convenience, only one column of memory cells in each of I/O Block 0 and I/O Block 15 is shown. As can be appreciated, a specific memory cell in I/O Block 0 can be selected by the wordline decoder selecting a specific wordline and the data buffer and logic circuitry 218 selecting a specific bitline and because the sources are all connected to a common voltage, the selection of a specific wordline and specific bitline selects a specific memory cell in the I/O Block 0. For example, as shown in FIG. 2, the wordline $WL_0$ is shown with a programming or APDE voltage applied to it and with the bitline 216 selected, the memory cell 202 is selected. At the same time, because wordline $WL_0$ has been selected, the selection of bitline 220 by data buffer and logic circuitry 222 results in memory cell 210 in the column 208 also being selected. As can be appreciated, because wordline $WL_0$ has been selected, a bitline in each of the I/O blocks 0 through 15 can be selected for an operation such as programming. For example, after all of the memory cells have been erased, the sector can be programmed a word (16 bits) at a time by selecting a wordline and the bitlines of the memory cells that need to be programmed. Therefore, as few as 1 memory cell can be programmed in the word or as many as 16 memory cells can be programmed in the word simultaneously. Because there is current flowing in each of the bitlines of the memory cells being programmed, the total current flowing through the common array source connection can vary depending upon the number of memory cells being programmed in the word. As discussed above, the current flowing in an individual bitline is a combination of the programming current flowing through the memory cell being programmed and the leakage current from memory cells on the bitline that have a low threshold voltage. The leakage current results because even though the wordlines of memory cells are grounded (0 volts) there is a voltage of approximately 5 volts applied to the drains and the low threshold voltage of some of the memory cells can cause a small but finite leakage current from those cells. There are at least two problems caused by the leakage current. First, the programming current from those cells being programmed combined with all of the leakage current requires a large current and therefore a large power supply. Second, because there is a finite resistance $R_{Bitline}$ in the bitline, indicated by the dashed resistor at 224, the increased bitline current caused by the leakage current increases the voltage drop $\Delta V = R_{bitline} \times I_{Bitline}$ across the resistance $R_{Bitline}$. The problem caused by the increased voltage drop $\Delta V$ is that the voltage drop ΔV decreases the drain voltage $V_D$ and thus the voltage between the drain and the source, $V_{DS}$. The drain voltage $V_D$ can drop below the required value (typically 4 volts) necessary for the reliable programming of the cells. In a system in which a 3-volt supply voltage is being used, a charge pump has to be utilized to increase the supply voltage to the necessary level and the voltage drop ΔV is even more critical.

Figure 3:
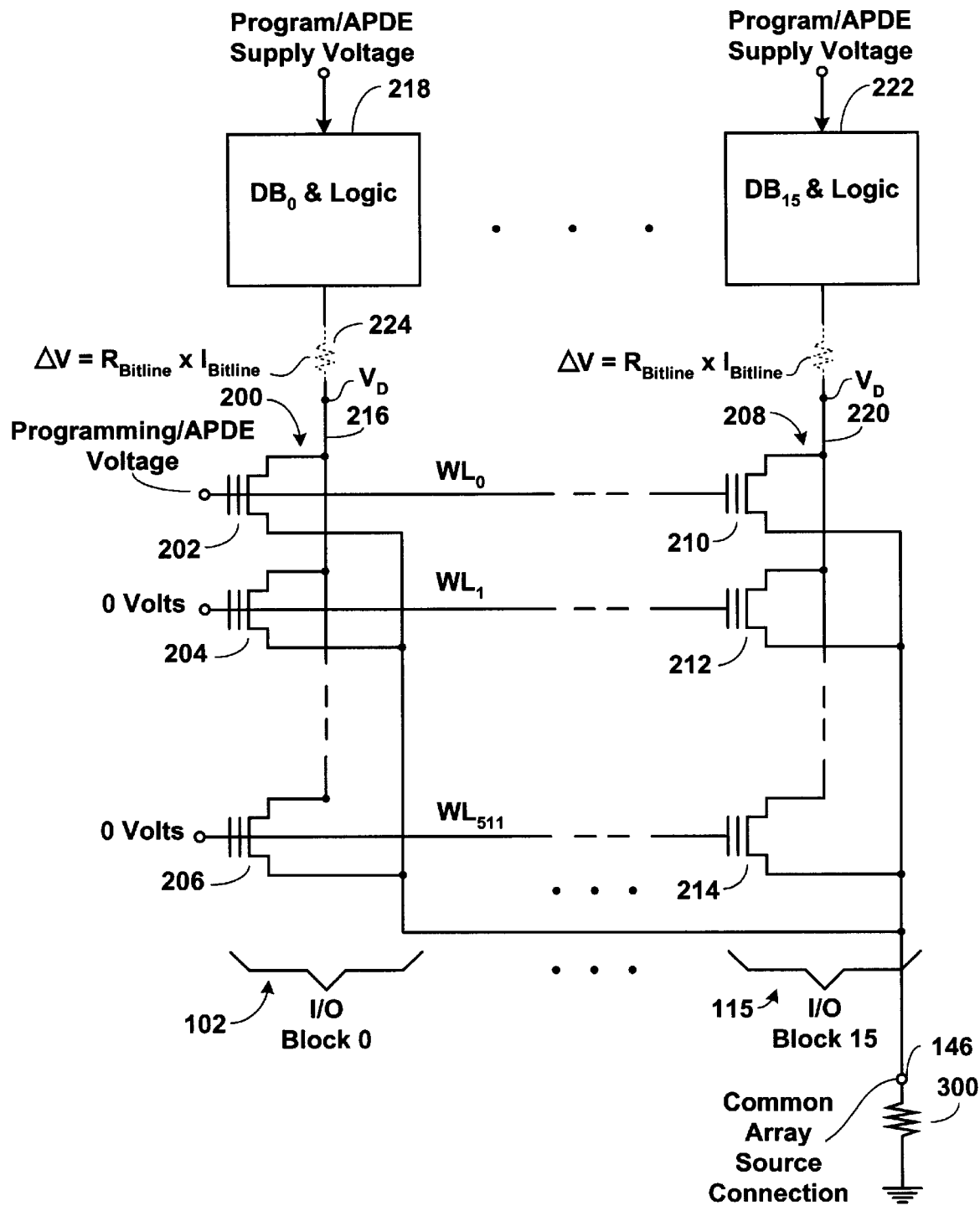
FIG. 3 is a detailed schematic diagram of the portion of the flash memory device shown in FIG. 2 with the common array source connection connected to a fixed resistance as known in the prior art.

FIG. 3 shows the detailed schematic as shown in FIG. 2 with a resistor 300 connected between the common array source connection 146 and ground as shown in the prior art. The resistor 300 serves to prevent bitline leakage from the memory cells that are not being programmed or not undergoing APDE (overerase correction). The resistor 300 causes the common array source connection 146 to be at a voltage above ground (0 volts). The value of the resistor 300 is selected so that the voltage at the common array source connection 146 is sufficient to raise the $V_t$ of all the cells via the "body effect" by generating a bias voltage between the substrate connection and the cell source such that the current of the most leaky cells is quenched. This prevents most, if not all, of the bitline leakage current. However, because there is only a single fixed resistor, the resistor 300 has varying success in preventing bitline leakage current depending upon the number of bits in the word being programmed. For example, if only one bit in the word is being programmed, there will only be one bitline selected (out of a possible 16 bitlines) and the current flowing through the resistor 300 will only be the programming current through the one bit being programmed and any leakage current from the remaining 511 memory cells connected to that bitline. This would cause the voltage drop across the resistor 300 to be relatively small as compared to the situation in which a large number of the 16 bits of the word were being programmed. For example, if 14 or 15 of the 16 bits were being programmed, the current flowing through the resistor 300 would be 14 or 15 times the programming current through a single cell and would include any leakage current from the remaining 511 memory cells in the 14 or 15 bitlines. As can be appreciated, the difference in the voltage drop across the resistor 300 could vary as much as a factor of 15 or larger because of the difference in the programming current through cells being programmed alone.

Figure 4:
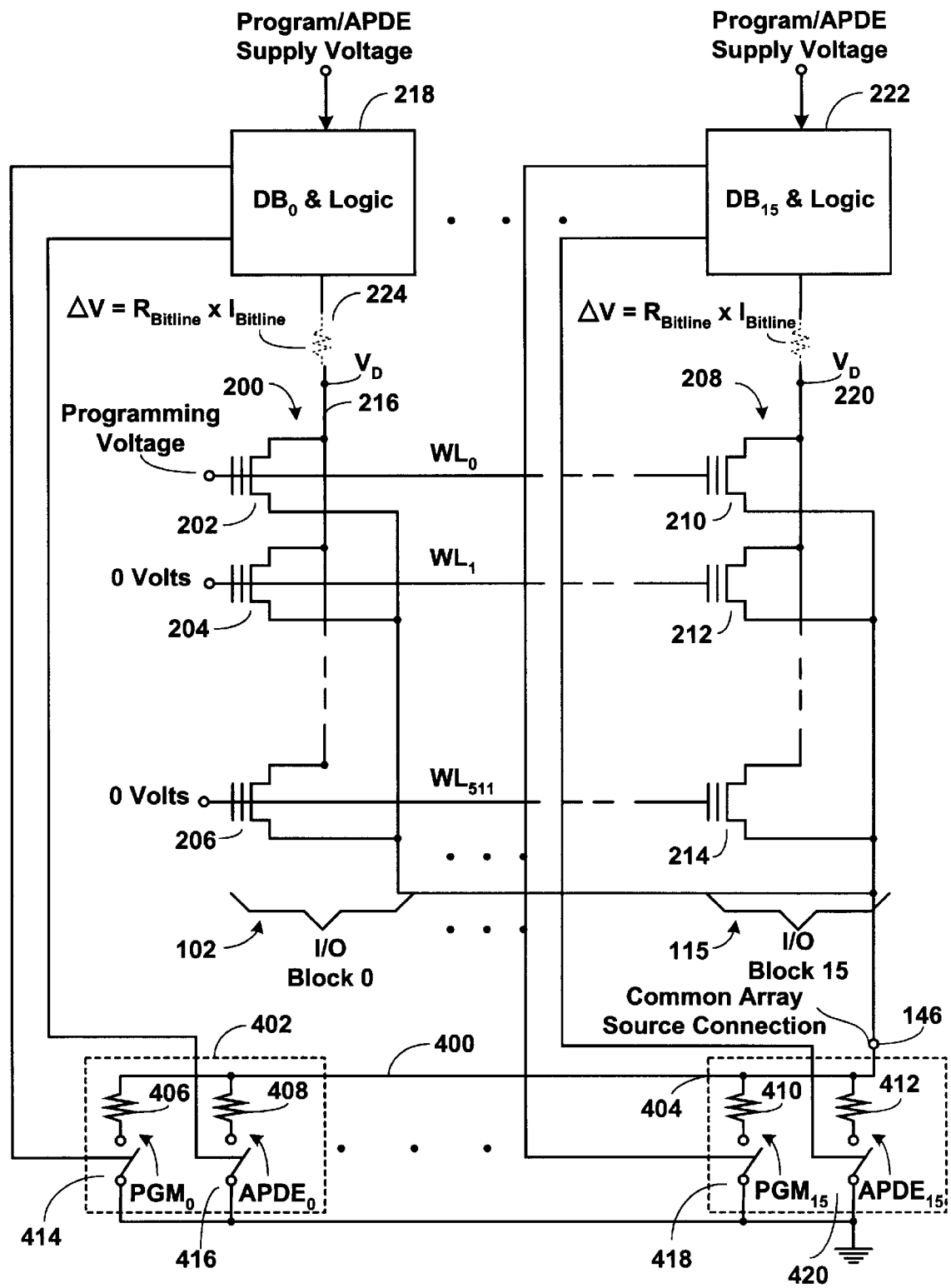
FIG. 4 is a detailed schematic diagram of the portion of the flash memory device shown in FIG. 2 with the common array source connection connected to a resistance array in accordance with the present invention.

FIG. 4 shows the detailed schematic as shown in FIGS. 2 & 3 with a resistor array 400 connected between the common array source connection 146 and ground in accordance with the present invention. The resistor array 400 has 16 sets of resistors represented by the first set within the dotted line at 402 and a second set within the dotted line at 404. There is a set of resistors associated with each I/O Block and therefore if the flash memory sector had 32 I/O Blocks there would be 32 sets of resistors. Each set of resistors is made up of two resistors, one resistor associated with a programming mode and the second associated with an APDE mode. For example, in resistor set 402 there is a first resistor 406 for the programming mode and a second resistor 408 for the APDE mode. Similarly, in resistor set 404 there is a first resistor 410 for the programming mode and a second resistor 412 for the APDE mode. Each resistor in the resistor sets has an associated switch. For example, programming resistor 406 in resistor set 402 has a switch 414 and APDE resistor 408 in resistor set 402 has a switch 416. Similarly, programming resistor 410 in resistor set 404 has a switch 418 and APDE resistor 412 has a switch 420. Each of the switches in each resistor set is controlled by the respective data buffer and logic circuitry. For example, the switches in resistor set 402, which is associated with I/O Block 0, are controlled by $DB_0$ & Logic 218. Similarly, the switches in resistor set 404, which is associated with I/O Block 15, are controlled by $DB_{15}$ & Logic 222.

The switches are closed by the respective $DB_0$ & Logic circuitry when a bitline is selected by the data buffer and logic circuitry for either a programming mode or an APDE mode. For example, if $DB_0$ & Logic 218 selects a bitline in I/O Block 0 in order to program a memory cell on the selected bitline, the $DB_0$ & Logic 218 causes switch 414 to close, which places $PGM_0$ (the programming mode resistor for I/O block 0) 406 in the circuit between the common array source connection 146 and ground. If $DB_0$ & Logic 218 selects a bitline in I/O Block 0 for APDE, the $DB_0$ & Logic 218 causes switch 416 to close, which places $APDE_0$ (the APDE mode resistor for I/O block 0) 408 in the circuit between the common array source connection 146 and ground. Similarly, if $DB_{15}$ & Logic 222 selects a bitline in I/O Block 15 in order to program a memory cell on the selected bitline, the $DB_{15}$ & Logic 222 causes switch 418 to close, which places $PGM_{15}$ (the programming mode resistor for I/O block 15) 410 in the circuit between the common array source connection 146 and ground. If $DB_{15}$ & Logic 222 selects a bitline in I/O Block 15 for APDE, the $DB_{15}$ & Logic 222 causes switch 420 to close, which places $APDE_{15}$ (the APDE mode resistor for I/O block 15) 412 in the circuit between the common array source connection 146 and ground. As should be appreciated, if there are memory cells in each I/O Block that are to be programmed there will be 16 Program resistors connected between the common array source connection 146 and ground during programming. Therefore, depending upon how many memory cells are to be programmed there can be anywhere from 1 to 16 programming mode resistors connected between the common array source connection 146 and ground during programming. Similarly, there can be from 1 to 16 APDE mode resistors connected between the common array source connection 146 and ground during APDE. Therefore, the voltage drop across the resistor array 400 is automatically adjusted up or down depending upon the number of memory cells being programmed or undergoing APDE. As should be appreciated, the resistors raise the common array source connection voltage to a value that is sufficient to raise the $V_t$ of all the cells via the "body effect" by generating a bias voltage between the substrate connection and the cell source such that the current of the most leaky cells is quenched.

The resistance values of the programming mode resistors and the APDE mode resistors are determined from the parametrics of the particular flash memory configuration and the threshold voltage distribution. The design engineer would determine from the threshold voltage distribution and the potential leakage current would exist during programming and APDE and further determine at what level the voltage at the common array source connection should be raised in order to quench leakage current from undererased memory cells. This would be a straightforward calculation and would yield different values for different configurations of flash memory cells.

It should be appreciated that although the switches are shown in FIG. 4 as mechanical switches, the switches are electronic switches manufactured as on-chip circuitry. Such switches are well known in the art and will not be further discussed.

In summary, the present invention overcomes the limitations of the prior art and fulfills the need to adequately and more reliably quench the bitline leakage current during the programming and APDE of a flash memory device. The described method and device provides for the quenching of bitline leakage current during the programming or APDE of the memory device. This provides a more reliable programming and APDE operation.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A semiconductor memory device, comprising:

flash memory cells organized in an array of n I/O blocks, each I/O block having m columns and p rows;

a drain of each flash memory cell in each column connected to a bitline;

a control gate of each flash memory cell in each row connected to a wordline;

a source of each flash memory cell in the array connected to a common array source connection;

each bitline in each of the n I/O blocks connected to a data buffer and logic circuitry device; and a resistor array connected between the common array source connection and ground potential.

2. The semiconductor memory device of claim 1 wherein the resistor array comprises a set of resistors for each of the n I/O blocks.

3. The semiconductor memory device of claim 2 wherein the set of resistors for each of the n I/O blocks comprises:

a programming mode resistor and a programming mode switch; and an (APDE) automatic programming disturb erase mode resistor and an APDE mode switch.

4. The semiconductor memory device of claim 3 further comprising:

a connection between the data buffer and logic circuitry device for each of the n I/O blocks and the programming mode switch for the corresponding I/O block; and a connection between the data buffer and logic circuitry device for each of the n I/O blocks and the APDE switch for the corresponding I/O block.

5. The semiconductor memory device of claim 4 further comprising:

switching circuitry in each of the data buffer and logic circuitry devices to close the corresponding programming mode switch during programming of a memory cell in a bitline controlled by the data buffer and logic circuitry device; and switching circuitry in each of the data buffer and logic circuitry devices to close the corresponding APDE mode switch during an APDE operation of a memory cell in a bitline controlled by the data buffer and logic circuitry device.

6. A method of quenching bitline leakage current in a semiconductor memory device in which the flash memory device comprises flash memory cells organized in an array of n I/O blocks, each I/O block having m columns and p rows, the method comprising:

connecting a drain of each flash memory cell in each column to a bitline;

connecting a control gate of each flash memory cell in each row to a wordline;

connecting a source of each flash memory cell in the array to a common array source connection;

connecting each bitline in each of the n I/O blocks to a data buffer and logic circuitry device; and connecting a resistor array between the common array source connection and ground potential.

7. The method of claim 6 wherein connecting a resistor array between the common array source connection and ground potential is accomplished by connecting a set of resistors for each of the n I/O blocks between the common array source connection and ground potential.

8. The method of claim 7 wherein connecting a set of resistors for each of the n I/O blocks between the common array source connection and ground potential is accomplished by:

connecting a programming mode resistor and a programming mode switch between the common array source connection and ground potential; and connecting an APDE mode resistor and an APDE mode switch between the common array source connection and ground potential.

9. The method of claim 8 further comprising:

connecting the data buffer and logic circuitry for each of the n I/O blocks to the programming mode switch for the corresponding I/O block; and connecting the data buffer and logic circuitry for each of the n I/O blocks and the APDE mode switch.

10. The method of claim 9 further comprising:

providing switching circuitry in each of the data buffer and logic circuitry devices to close the corresponding programming mode switch during programming of a memory cell in a bitline controlled by the data buffer and logic circuitry device; and providing switching circuitry in each of the data buffer and logic circuitry devices to close the corresponding APDE mode switch during an APDE operation of a memory cell in a bitline controlled by the data buffer and logic circuitry device.

11. The method of claim 10 further comprising closing the programming mode switches associated with I/O blocks in which memory cells are being programmed.

12. The method of claim 10 further comprising closing the APDE mode switches associated with I/O blocks in which memory cells are in an APDE mode.

* * * * *